(12) United States Patent
Ichijo et al.

(10) Patent No.: US 12,170,492 B2
(45) Date of Patent: Dec. 17, 2024

(54) ELECTRIC POWER CONVERSION APPARATUS

(71) Applicant: DENSO CORPORATION, Kariya (JP)

(72) Inventors: Hiromi Ichijo, Kariya (JP); Mitsunori Kimura, Kariya (JP)

(73) Assignee: DENSO CORPORATION, Kariya (JP)

( * ) Notice: Subject to any disclaimer, the term of this patent is extended or adjusted under 35 U.S.C. 154(b) by 235 days.

(21) Appl. No.: 17/712,553

(22) Filed: Apr. 4, 2022

(65) Prior Publication Data

US 2022/0231617 A1    Jul. 21, 2022

Related U.S. Application Data

(63) Continuation of application No. PCT/JP2020/031255, filed on Aug. 19, 2020.

(30) Foreign Application Priority Data

Oct. 3, 2019   (JP) .................... 2019-182844

(51) Int. Cl.
*H02M 7/53* (2006.01)
*B60L 3/00* (2019.01)
(Continued)

(52) U.S. Cl.
CPC ............ *H02M 7/537* (2013.01); *B60L 3/003* (2013.01); *H02M 1/08* (2013.01); *H05K 7/20927* (2013.01); *B60L 2210/40* (2013.01)

(58) Field of Classification Search
CPC .... H02M 7/537; H02M 1/08; H05K 7/20927; B60L 3/003
See application file for complete search history.

(56) References Cited

U.S. PATENT DOCUMENTS

| 8,863,869 B2 * | 10/2014 | Nakatsu | H05K 7/20 |
| | | | 361/689 |
| 2013/0110430 A1 * | 5/2013 | Nishi | G01R 31/382 |
| | | | 702/63 |
| 2020/0221611 A1 | 7/2020 | Kobayashi et al. | |

FOREIGN PATENT DOCUMENTS

| JP | 2012-060793 A | 3/2012 |
| JP | 2013-198255 A | 9/2013 |

(Continued)

OTHER PUBLICATIONS

Sep. 29, 2020 International Search Report issued in International Patent Application No. PCT/JP2020/031255.

*Primary Examiner* — Jue Zhang
*Assistant Examiner* — Afework S Demisse
(74) *Attorney, Agent, or Firm* — Oliff PLC

(57) ABSTRACT

An electric power conversion apparatus includes a semiconductor module, a control circuit board and a wireless communication unit. The semiconductor module has at least one semiconductor element built therein. The control circuit board is configured to control the semiconductor module. The wireless communication unit is configured to wirelessly communicate electrical signals between the semiconductor module and the control circuit board. The wireless communication unit includes a first communication device provided on the control circuit board so as to face the semiconductor module, and a second communication device provided on the semiconductor module so as to face the control circuit board. Moreover, there are no obstacles on a straight path between the first and second communication devices.

5 Claims, 5 Drawing Sheets

(51) Int. Cl.
  *H02M 1/08* (2006.01)
  *H02M 7/537* (2006.01)
  *H05K 7/20* (2006.01)

(56) References Cited

FOREIGN PATENT DOCUMENTS

JP   2017-139935 A    8/2017
WO   WO-2013054413 A1 *  4/2013  .......... B60L 15/009

* cited by examiner

ELECTRIC POWER CONVERSION APPARATUS

CROSS-REFERENCE TO RELATED APPLICATIONS

The present application is a continuation application of International Application No. PCT/JP2020/031255 filed on Aug. 19, 2020, which is based on and claims priority from Japanese Patent Application No. 2019-182844 filed on Oct. 3, 2019. The entire contents of these applications are incorporated by reference into the present application.

BACKGROUND

1 Technical Field

The present disclosure relates to electric power conversion apparatuses.

2 Description of Related Art

Vehicles, such as electric vehicles and hybrid vehicles, are generally equipped with electric power conversion apparatuses that perform electric power conversion between DC power and AC power.

SUMMARY

According to the present disclosure, there is provided an electric power conversion apparatus which includes a semiconductor module, a control circuit board and a wireless communication unit. The semiconductor module has at least one semiconductor element built therein. The control circuit board is configured to control the semiconductor module. The wireless communication unit is configured to wirelessly communicate electrical signals between the semiconductor module and the control circuit board. The wireless communication unit includes a first communication device provided on the control circuit board so as to face the semiconductor module, and a second communication device provided on the semiconductor module so as to face the control circuit board. Moreover, there are no obstacles on a straight path between the first and second communication devices.

DESCRIPTION OF EMBODIMENTS

Figure 1:
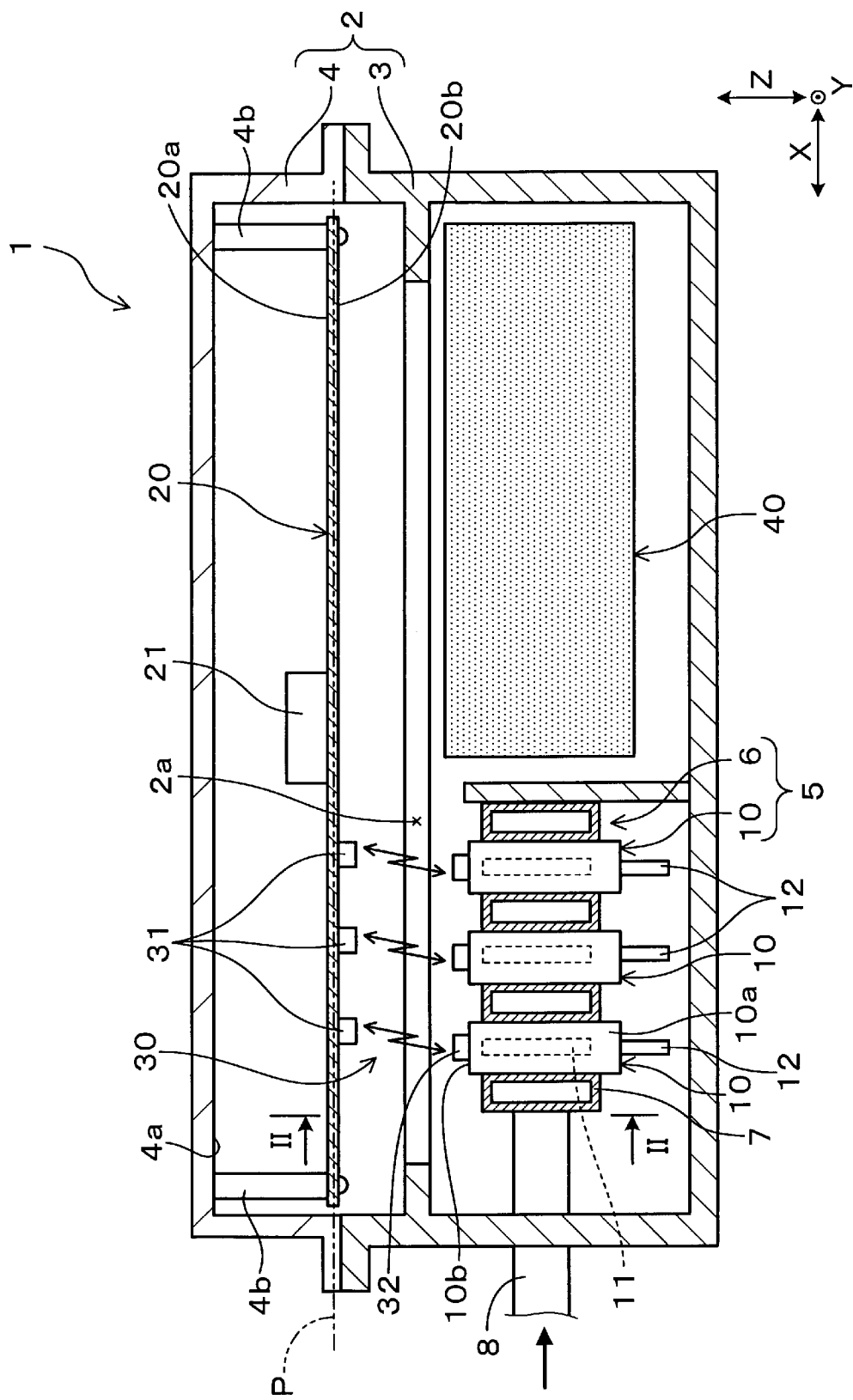
FIG. 1 is a cross-sectional view of an electric power conversion apparatus according to a first embodiment.

Japanese Patent Application Publication No. JP 2017-139935 A discloses an electric power conversion apparatus which includes semiconductor modules each having a semiconductor element built therein and a control circuit board configured to control the semiconductor modules. In the electric power conversion apparatus, control terminals of the semiconductor modules are electrically connected to the control circuit board.

During the assembly of the electric power conversion apparatus disclosed in the above patent document, the control terminals of the semiconductor modules are inserted respectively into terminal insertion holes, which are formed so as to penetrate the control circuit board, and then joined to the control circuit board. However, the assembly process is troublesome because it is necessary to align the control terminals of the semiconductor modules respectively with the terminal insertion holes formed in the control circuit board. This problem becomes remarkable particularly with increase in the number of the semiconductor modules.

In contrast, the above-described electric power conversion apparatus according to the present disclosure has the wireless communication unit configured to wirelessly communicate electrical signals between the semiconductor module and the control circuit board. Consequently, it becomes unnecessary to connect a control terminal of the semiconductor module to the control circuit board in a wired manner. Accordingly, it becomes possible to omit a step of making a wired connection between the semiconductor module and the control circuit board from the assembly process of the electric power conversion apparatus.

Moreover, in the case of the electric power conversion apparatus disclosed in the above patent document, it is easy for positional deviations of the control terminals of the semiconductor modules to occur due to assembly tolerances, making the assembly process of the electric power conversion apparatus difficult. In contrast, the electric power conversion apparatus according to the present disclosure does not involve such a problem because no wired connection is necessary between the semiconductor module and the control circuit board.

Hence, according to the present disclosure, it becomes possible to provide an effective technique for improving the ease of assembly of an electric power conversion apparatus which includes at least one semiconductor module and a control circuit board.

In addition, in the electric power conversion apparatus according to the present disclosure, there are no obstacles (i.e., neither other members nor walls) on the straight path between the first and second communication devices. Consequently, it becomes possible to prevent wireless communication of electrical signals between the first and second communication devices from being disturbed by obstacles. As a result, it becomes possible to ensure the reliability of the wireless communication of electrical signals between the first and second communication devices.

Exemplary embodiments will be described hereinafter with reference to the drawings. It should be noted that for the sake of clarity and understanding, identical components having identical functions throughout the whole description have been marked, where possible, with the same reference numerals in the drawings and that for the sake of avoiding redundancy, explanation of identical components will not be repeated.

In addition, unless otherwise specified, in the drawings: a first direction representing a thickness direction of semiconductor switching elements of semiconductor modules is indicated by an arrow X; a second direction perpendicular to the first direction is indicated by an arrow Y; and a third direction perpendicular to both the first direction and the second direction is indicated by an arrow Z.

First Embodiment

Figure 2:
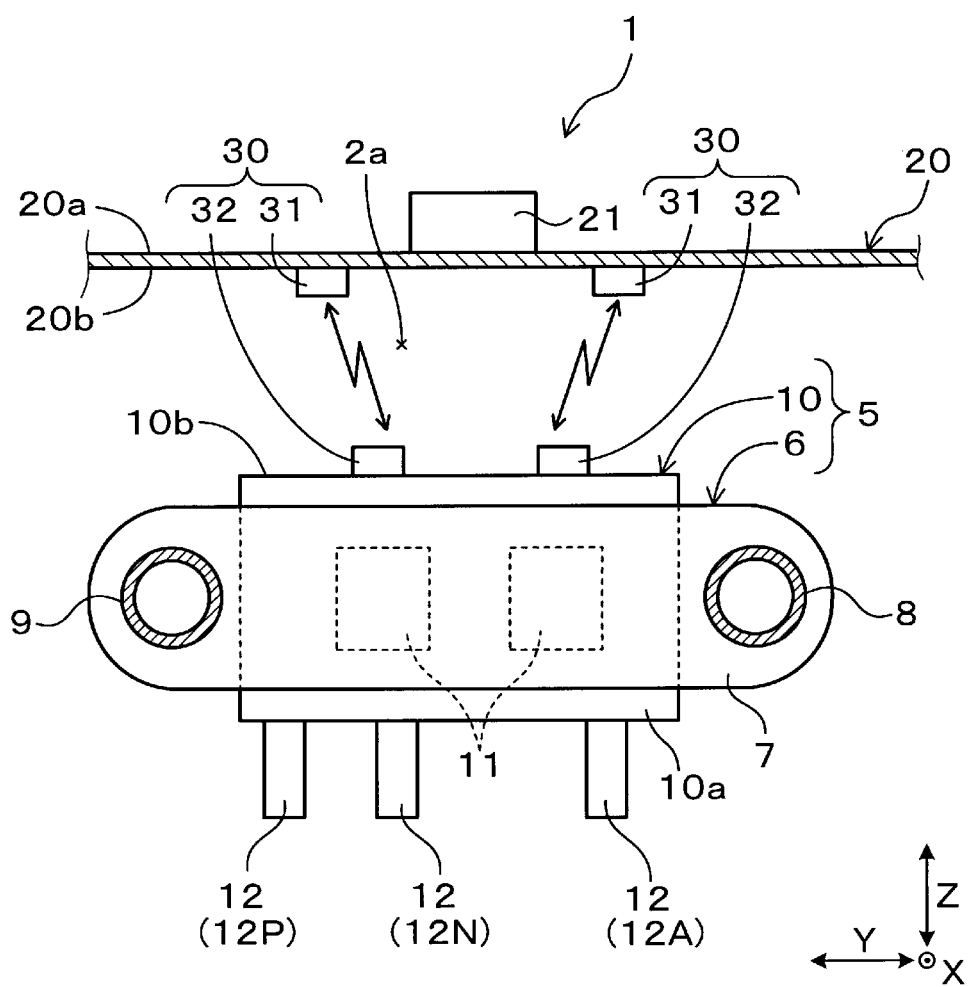
FIG. 2 is a cross-sectional view taken along the line II-II and viewed along arrows in FIG. 1.

As shown in FIGS. 1 and 2, an electric power conversion apparatus 1 according to the first embodiment includes a plurality of semiconductor modules 10, a control circuit board 20 configured to control the semiconductor modules 10, a wireless communication unit 30 configured to wirelessly communicate electrical signals between each of the semiconductor modules 10 and the control circuit board 20, and a capacitor 40.

The electric power conversion apparatus 1 is installed in a vehicle such as an electric vehicle or a hybrid vehicle. In the present embodiment, the electric power conversion apparatus 1 is configured as an inverter to convert DC power of a power supply B into AC power required for driving a traction motor M of the vehicle (see FIG. 3). In addition, the power supply B may be implemented by, for example, a storage battery such as a lead-acid battery or a lithium-ion battery.

In the electric power conversion apparatus 1, each of the semiconductor modules 10 includes a pair of semiconductor switching elements 11 (see FIG. 3) for converting DC power into AC power, and a plurality of power terminals 12.

Specifically, in each of the semiconductor modules 10, the semiconductor switching elements 11 are built in a main body 10a of the semiconductor module 10. Each of the semiconductor switching elements 11 is implemented by a power switching element such as an IGBT (Insulated Gate Bipolar Transistor) or a MOSFET (Metal-Oxide-Semiconductor Field-Effect Transistor). On the other hand, each of the power terminals 12 protrudes downward from the main body 10a in which the semiconductor switching elements 11 are built.

The electric power conversion apparatus 1 further includes a cooler 6 for cooling the semiconductor modules 10. As shown in FIG. 2, the cooler 6 includes a plurality of cooling pipes 7 through which a coolant flows, an inflow pipe 8 connected to an inflow header portion that is common to the cooling pipes 7, and an outflow pipe 9 connected to an outflow header portion that is common to the cooling pipes 7.

The coolant may be implemented by, for example, a natural coolant such as water or ammonia, water mixed with an ethylene glycol-based antifreeze, a fluorocarbon-based coolant such as Fluorinert, HCFC123 or HFC134a, an alcohol-based coolant such as methanol or alcohol, or a ketone-based coolant such as acetone.

The cooling pipes 7 of the cooler 6 and the semiconductor modules 10 are stacked together to form a module stack 5. Specifically, in the module stack 5, the cooling pipes 7 of the cooler 6 are stacked alternately with the semiconductor modules 10 in a stacking direction; the stacking direction is parallel to an extending plane P of the control circuit board 20 (or a plane P in which the control circuit board 20 extends) and coincides with the first direction X that represents the thickness direction of the semiconductor switching elements 11 of the semiconductor modules 10. That is, the stacking direction coincides with the thickness direction of the semiconductor switching elements 11. In addition, the main bodies 10a of the semiconductor modules 10 have major surfaces thereof parallel to the semiconductor switching elements 11; and the normal direction of the major surfaces coincides with the thickness direction of the semiconductor switching elements 11 and thus with the stacking direction. Such an arrangement of the semiconductor modules 10 may be referred to as a "stacked arrangement".

Furthermore, in the electric power conversion apparatus 1, there is provided a pressure-applying member (not shown) to apply pressure in the first direction X to the semiconductor modules 10 each of which is sandwiched between an adjacent pair of the cooling pipes 7 of the cooler 6 in the first direction X. Consequently, each of the semiconductor modules 10 is cooled through heat exchange with the coolant flowing through the adjacent pair of the cooling pipes 7.

In addition, the number of the semiconductor modules 10 is not limited to a particular number and can be changed as appropriate. On the other hand, it is preferable to set the number of the cooling pipes 7 of the cooler 6 according to the number of the semiconductor modules 10.

The control circuit board 20 is configured to control the switching operation (or on/off operation) of the semiconductor switching elements 11 of the semiconductor modules 10. The control circuit board 20 is arranged above the semiconductor modules 10 so as to face the semiconductor modules 10 through a space 2a formed between the control circuit board 20 and the semiconductor modules 10. Moreover, the control circuit board 20 is formed to extend in the plane P which is defined by both the first direction X and the second direction Y that is perpendicular to the first direction X. On an upper surface 20a of the control circuit board 20, there is provided an ECU 21 as a controller for controlling the semiconductor modules 10.

The wireless communication unit 30 includes a plurality of first communication devices 31 and a plurality of second communication devices 32. The first communication devices 31 are provided on the control circuit board 20 so as to face the semiconductor modules 10 in the third direction Z. Each of the second communication devices 32 is provided on a corresponding one of the semiconductor modules 10 so as to face the control circuit board 20 in the third direction Z.

The wireless communication unit 30 is configured to perform two-way (or bidirectional) communication between each corresponding pair of the first communication devices 31 and the second communication devices 32. Specifically, in the present embodiment, each of the first and second communication devices 31 and 32 is configured as a transceiver. That is, when each of the first communication devices 31 functions as a transmitter to transmit (or emit) an electrical signal (also referred to as a "radio-frequency signal"), the corresponding one of the second communication devices 32 functions as a receiver to receive the electrical signal. On the other hand, when each of the second communication devices 32 functions as a transmitter to transmit an electrical signal, the corresponding one of the first communication devices 31 functions as a receiver to receive the electrical signal.

Moreover, in the present embodiment, to prevent wireless communication of electrical signals between the corresponding first and second communication devices 31 and 32 from being disturbed, the wireless communication unit 30 is configured so that there are no obstacles (i.e., neither other members nor walls) on straight paths between the corresponding first and second communication devices 31 and 32.

The electric power conversion apparatus 1 further includes a housing 2 which is composed of a bottomed box-shaped case 3 with an opening and a cover 4 that covers the opening of the case 3. In the case 3, there are received the module stack 5, the wireless communication unit 30 and a plurality of heat-generating components including the capacitor 40. The control circuit board 20 is mounted to a part of the cover 4 which faces the semiconductor modules 10. More specifically, a plurality of boss portions 4b are formed on a back surface (or interior surface) 4a of the cover 4; and the control circuit board 20 is fixed to the boss portions 4b. In addition, it is preferable that both the case 3 and the cover 4 are formed of a metal material having high heat conductivity, i.e., a metal material excellent in heat dissipation.

As shown in FIG. 2, each of the semiconductor modules 10 has three power terminals 12 protruding in parallel with each other from a lower surface of the main body 10a thereof to the lower side in the third direction Z. The three power terminals 12 include a positive-electrode terminal 12P, a negative-electrode terminal 12N and an output terminal 12A. In addition, it should be noted that the arrangement and the protruding direction of the three power terminals 12 are not particularly limited.

Moreover, each of the semiconductor modules 10 has a pair of semiconductor switching elements 11 built in the main body 10a thereof. Furthermore, each of the semiconductor modules 10 has two second communication devices 32 mounted on an upper surface 10b of the main body 10a thereof in alignment with each other in the second direction Y; the upper surface 10b of the main body 10a faces the control circuit board 20. The two second communication devices 32 are provided respectively for controlling the pair of semiconductor switching elements 11 of the semiconductor module 10. In other words, the two second communication devices 32 respectively correspond to the pair of semiconductor switching elements 11 of the semiconductor module 10. Moreover, the two second communication devices 32 are configured to perform wireless communication respectively with two first communication devices 31 mounted on a lower surface 20b of the control circuit board 20. In other words, the two first communication devices 31 respectively correspond to the two second communication devices 32.

In addition, it is preferable that the number of the first communication devices 31 and the number of the second communication devices 32 are set to be equal to each other. However, the number of the first communication devices 31 and the number of the second communication devices 32 may also be set to be different from each other as necessary.

Figure 3:
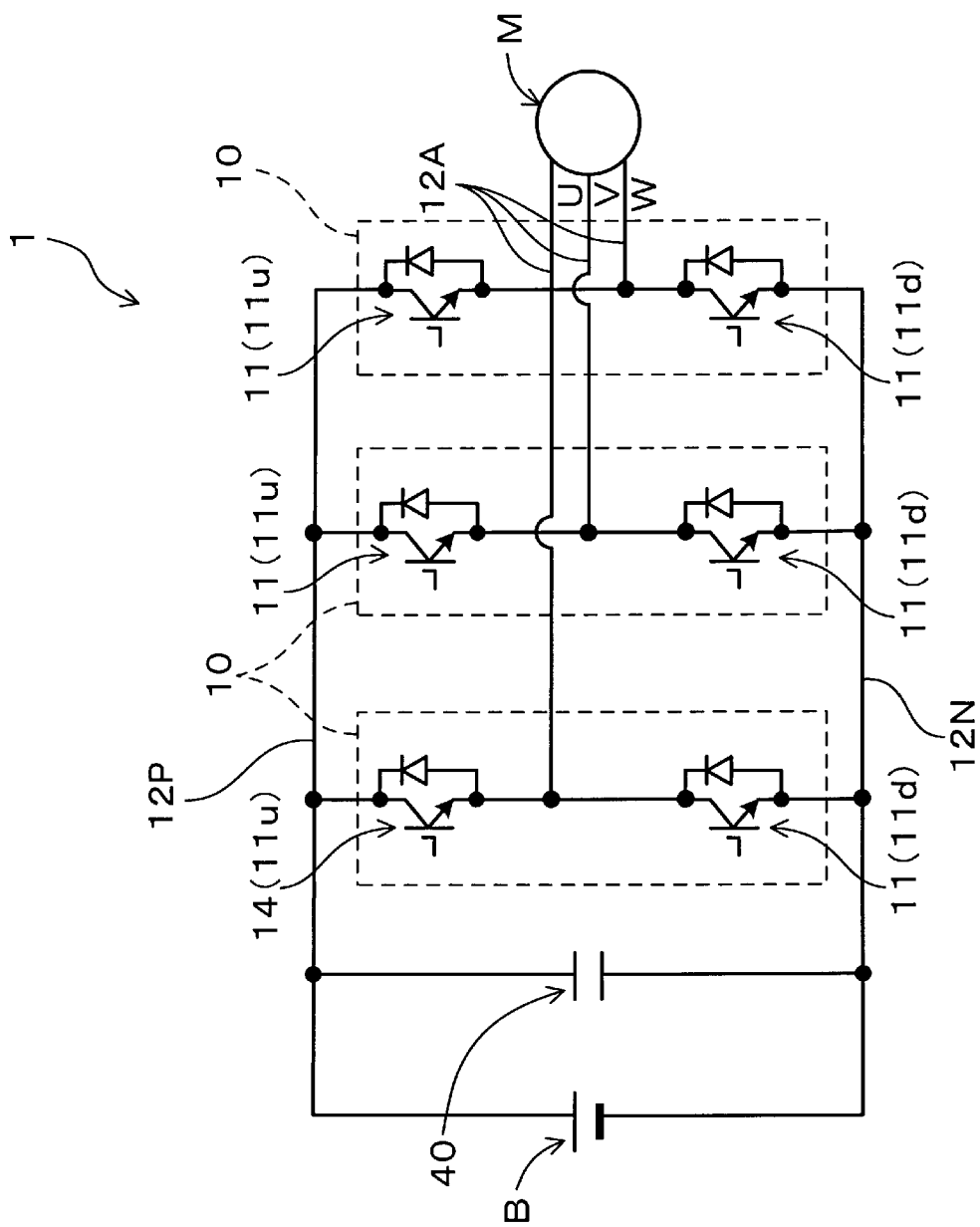
FIG. 3 is a circuit diagram illustrating an inverter circuit of the electric power conversion apparatus according to the first embodiment.

As shown in FIG. 3, an inverter circuit formed in the electric power conversion apparatus 1 has legs of three phases (i.e., U, V and W phases) connected in parallel to each other between a positive electrode and a negative electrode of the power supply B. Each of the legs is formed of an upper-arm semiconductor switching element 11u and a lower-arm semiconductor switching element 11d that are built in the main body 10a of a corresponding one of the semiconductor modules 10 and connected in series with each other. The upper-arm semiconductor switching element 11u is electrically connected to the positive electrode of the power supply B via the positive-electrode terminal 12P of the semiconductor module 10, whereas the lower-arm semiconductor switching element 11d is electrically connected to the negative electrode of the power supply B via the negative-electrode terminal 12N of the semiconductor module 10. Moreover, in each of the legs, a junction point between the upper-arm semiconductor switching element 11u and the lower-arm semiconductor switching element 11d is electrically connected, via the output terminal 12A of the semiconductor module 10, to a corresponding one of three terminals (i.e., U-phase, V-phase and W-phase terminals) of the motor M. In addition, each of the upper-arm and lower-arm semiconductor switching elements 11u and 11d has a flyback diode (or freewheeling diode) connected in antiparallel thereto.

Figure 4:
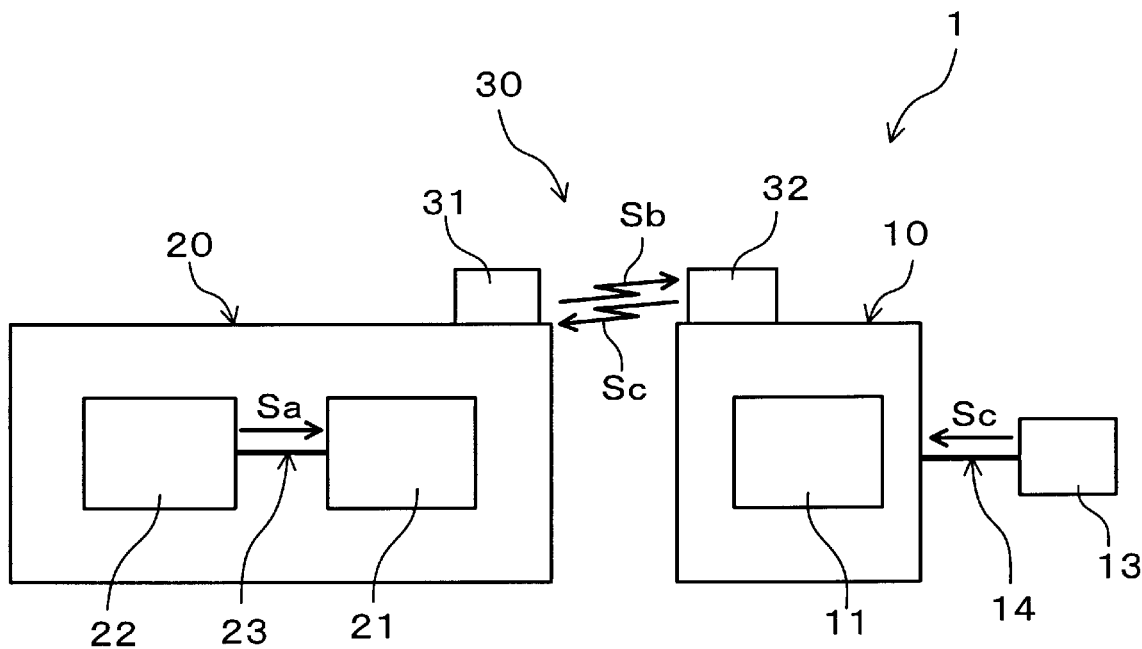
FIG. 4 is a schematic diagram illustrating a wireless communication structure of the electric power conversion apparatus according to the first embodiment.

FIG. 4 illustrates a wireless communication structure of the electric power conversion apparatus 1 according to the present embodiment. As shown in FIG. 4, a drive IC 22 is provided, in addition to the ECU 21, on the control circuit board 20.

The drive IC 22 is electrically connected with the ECU 21 via an electrically-conductive member 23. On the other hand, the semiconductor modules 10 are electrically connected, via electrically-conductive members 14, with a detection unit 13 which includes sensors such as a temperature sensor and a current sensor.

In operation, control signals Sa are sent from the ECU 21 to the drive IC 22 through the electrically-conductive member 23. Based on the control signals Sa, the drive IC 22 outputs gate signals Sb which are electrical signals. Then, the gate signals Sb are wirelessly transmitted by the first communication devices 31 each functioning as a transmitter to the second communication devices 32 each functioning as a receiver. Thereafter, the gate signals Sb are sent from the second communication devices 32 to gate terminals of the semiconductor switching elements 11. Consequently, the semiconductor switching elements 11 are driven by the gate signals Sb to be turned on and off.

On the other hand, the detection unit 13 outputs detection signals Sc which are electrical signals indicating information detected by the sensors. Then, the detection signals Sc are sent to the semiconductor modules 10 through the electrically-conductive members 14, and further sent to the second communication devices 32 provided on the semiconductor modules 10. Thereafter, the detection signals Sc are wirelessly transmitted by the second communication devices 32 each functioning as a transmitter to the first communication devices 31 each functioning as a receiver. Then, the detection signals Sc are sent from the first communication devices 31 to the ECU 21.

According to the present embodiment, it is possible to achieve the following advantageous effects.

The electric power conversion apparatus 1 according to the present embodiment has the wireless communication unit 30 configured to wirelessly communicate the electrical signals (i.e., the gate signals Sb and the detection signals Sc) between each of the semiconductor modules 10 and the control circuit board 20. Consequently, it becomes unnecessary to connect control terminals of the semiconductor modules 10 to the control circuit board 20 in a wired manner. Accordingly, it becomes possible to omit a step of making wired connections between the semiconductor modules 10 and the control circuit board 20 from the assembly process of the electric power conversion apparatus 1.

Moreover, in the case of arranging the semiconductor modules 10 in a stacked manner and connecting control terminals of the semiconductor modules 10 to the control circuit board 20 in a wired manner, it is easy for positional deviations of the control modules to occur due to assembly tolerances, making the assembly process of the electric power conversion apparatus difficult. In contrast, the electric power conversion apparatus 1 according to the present embodiment does not involve such a problem because no wired connections are necessary between the semiconductor modules 10 and the control circuit board 20.

Hence, according to the present embodiment, it becomes possible to provide an effective technique for improving the ease of assembly of the electric power conversion apparatus 1 which includes the semiconductor modules 10 and the control circuit board 20.

Furthermore, in the case of connecting control terminals of the semiconductor modules 10 to the control circuit board 20 in a wired manner, after the assembly process of the electric power conversion apparatus, stress may be induced in the control terminals due to relative displacement between the semiconductor modules 10 and the control circuit board 20. In contrast, the electric power conversion apparatus 1 according to the present embodiment does not involve such a problem because no wired connections are necessary between the semiconductor modules 10 and the control circuit board 20. Consequently, it becomes possible to ensure high vibration resistance of the electric power conversion apparatus 1.

Moreover, in the electric power conversion apparatus 1 according to the present embodiment, there are no obstacles (i.e., neither other members nor walls) on straight paths between the corresponding first and second communication devices 31 and 32. Consequently, it becomes possible to prevent wireless communication of the electrical signals (i.e., the gate signals Sb and the detection signals Sc) between the corresponding first and second communication devices 31 and 32 from being disturbed by obstacles. As a result, it becomes possible to ensure the reliability of the wireless communication of the electrical signals between the corresponding first and second communication devices 31 and 32.

In the electric power conversion apparatus 1 according to the present embodiment, each of the semiconductor modules 10 has the pair of semiconductor switching elements 11 built therein. The wireless communication unit 30 includes the plurality of second communication devices 32 each corresponding to one of the semiconductor switching elements 11 of the semiconductor modules 10, and the plurality of first communication devices 31 each corresponding to one of the plurality of second communication devices 32.

In the case of connecting the semiconductor switching elements 11 of the semiconductor modules 10 to the control circuit board 20 in a wired manner, the ease of assembly of the electric power conversion apparatus may be lowered with increase in the number of the semiconductor switching elements 11 of the semiconductor modules 10. In contrast, with the wireless communication structure of the electric power conversion apparatus 1 according to the present embodiment, it becomes possible to prevent the ease of assembly of the electric power conversion apparatus 1 from being lowered with increase in the number of the semiconductor switching elements 11 of the semiconductor modules 10. Moreover, in the electric power conversion apparatus 1, with increase in the number of the communication devices 31 and 32, the reliability of the wireless communication of the electrical signals between the corresponding first and second communication devices 31 and 32 may be lowered. In this regard, in the present embodiment, the wireless communication unit 30 is configured so that there are no obstacles on straight paths between the corresponding first and second communication devices 31 and 32. Consequently, it becomes possible to prevent the reliability of the wireless communication of the electrical signals between the corresponding first and second communication devices 31 and 32 from being lowered with increase in the number of the communication devices 31 and 32.

The electric power conversion apparatus 1 according to the present embodiment includes the bottomed box-shaped case 3 in which the semiconductor modules 10 are received, and the cover 4 that covers the opening of the case 3. The control circuit board 20 is mounted to a part of the cover 4 which faces the semiconductor modules 10. That is, the control circuit board 20 is mounted to the cover 4 that is a separate member from the case 3 in which the semiconductor modules 10 are received.

With the above structure, in the case of connecting control terminals of the semiconductor modules 10 to the control circuit board 20 in a wired manner, it is difficult to correct positional deviations of the control terminals of the semiconductor modules 10 with respect to the control circuit board 20. In contrast, with the wireless communication structure of the electric power conversion apparatus 1 according to the present embodiment, it becomes unnecessary to connect control terminals of the semiconductor modules 10 to the control circuit board 20 in a wired manner. Consequently, it becomes possible to omit the step of correcting positional deviations of the control terminals of the semiconductor modules 10 with respect to the control circuit board 20 from the assembly process of the electric power conversion apparatus 1. As a result, it becomes possible to improve the ease of assembly of the electric power conversion apparatus 1; it also becomes possible to prevent stress from being induced in the control terminals due to relative displacement between the semiconductor modules 10 and the control circuit board 20.

The electric power conversion apparatus 1 according to the present embodiment includes the cooler 6 configured to cool the semiconductor modules 10. The cooler 6 includes the cooling pipes 7 through which the coolant flows. The cooling pipes 7 are stacked alternately with the semiconductor modules 10 in the stacking direction that is parallel to the extending plane P of the control circuit board 20 and coincides with the thickness direction X of the semiconductor switching elements 11 of the semiconductor modules 10.

With the above stacked arrangement, it becomes possible to effectively cool the semiconductor modules 10 while realizing wireless communication between the semiconductor modules 10 and the control circuit board 20.

Modification of First Embodiment

In the wireless communication structure according to the first embodiment, the drive IC 22 is provided, together with the ECU 21, on the control circuit board 20 (see FIG. 4).

Figure 5:
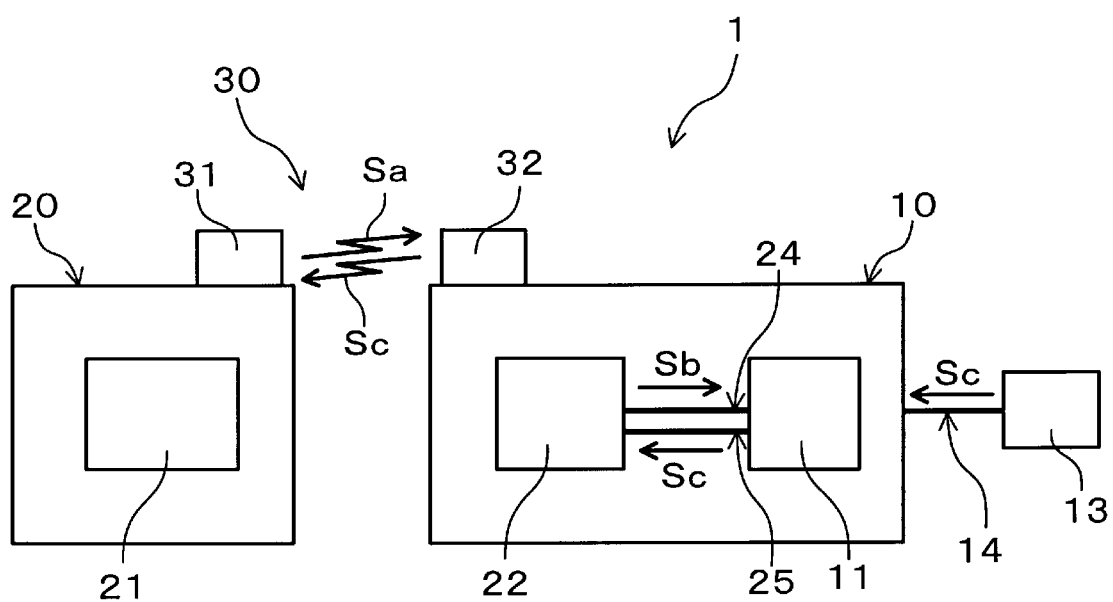
FIG. 5 is a schematic diagram illustrating a wireless communication structure of an electric power conversion apparatus according to a modification of the first embodiment.

In contrast, in a wireless communication structure according to the present modification, as shown in FIG. 5, there is no drive IC provided on the control circuit board 20. Instead, each of the semiconductor modules 10 has a drive IC 22 provided therein. The drive IC 22 is electrically connected with the semiconductor switching elements 11 of the semiconductor module 10 via electrically-conductive members 24.

In operation, the ECU 21 outputs control signals Sa which are electrical signals. Then, the control signals Sa are wirelessly transmitted by the first communication devices 31 each functioning as a transmitter to the second communication devices 32 each functioning as a receiver. Thereafter, the control signals Sa are sent from the second communication devices 32 to the drive ICs 22 of the semiconductor modules 10. Based on the control signals Sa, the drive ICs 22 output gate signals Sb. Then, the gate signals Sb are sent to the gate terminals of the semiconductor switching elements 11 through the electrically-conductive members 24. Consequently, the semiconductor switching elements 11 are driven by the gate signals Sb to be turned on and off.

On the other hand, the detection unit 13 outputs the detection signals Sc which are electrical signals indicating information detected by the sensors. Then, the detection signals Sc are sent to the semiconductor modules 10 through the electrically-conductive members 14, and further sent to the drive ICs 22 through electrically-conductive members 25. Thereafter, the detection signals Sc are further sent to the second communication devices 32 provided on the semiconductor modules 10. Then, the detection signals Sc are wirelessly transmitted by the second communication devices 32 each functioning as a transmitter to the first communication devices 31 each functioning as a receiver. Thereafter, the detection signals Sc are sent from the first communication devices 31 to the ECU 21.

With the above wireless communication structure according to the present modification, it is also possible to achieve the same advantageous effects as achievable with the wireless communication structure according to the first embodiment.

Second Embodiment

An electric power conversion apparatus 101 according to the second embodiment has a similar configuration to the electric power conversion apparatus 1 according to the first embodiment. Therefore, the differences therebetween will be mainly described hereinafter.

Figure 6:
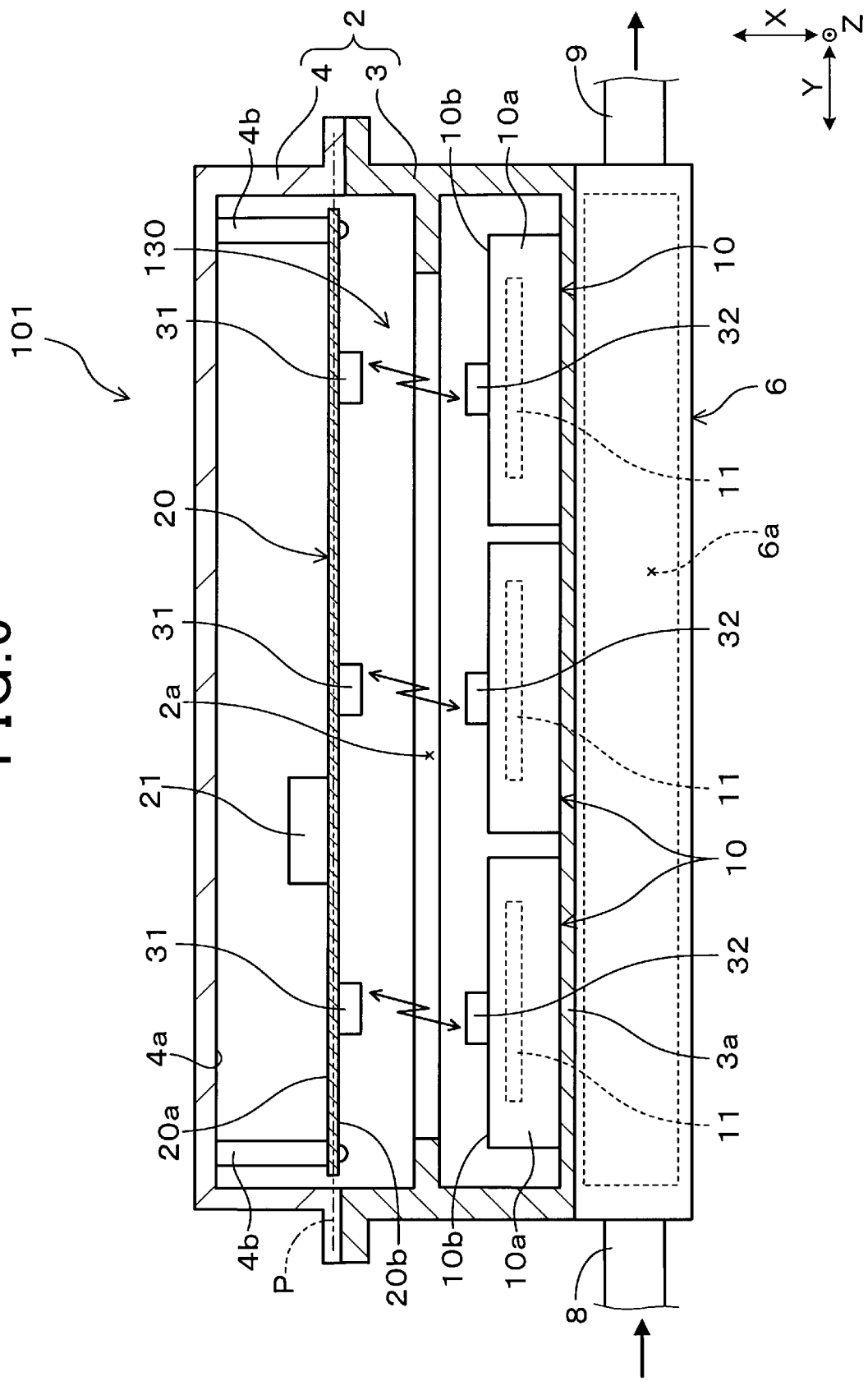
FIG. 6 is a cross-sectional view of an electric power conversion apparatus according to a second embodiment.

FIG. 6 illustrates the configuration of the electric power conversion apparatus 101 according to the present embodiment. Compared to the electric power conversion apparatus 1 according to the first embodiment (see FIG. 1), the electric power conversion apparatus 101 according to the present embodiment differs in the arrangement of the semiconductor modules 10.

Specifically, as shown in FIG. 6, in the electric power conversion apparatus 101 according to the present embodiment, the semiconductor modules 10 are arranged in alignment with each other in an alignment direction; the alignment direction is parallel to the extending plane P of the control circuit board 20 and coincides with the second direction Y that is perpendicular to the first direction X representing the thickness direction of the semiconductor switching elements 11 of the semiconductor modules 10. That is, the alignment direction is perpendicular to the thickness direction of the semiconductor switching elements 11. Moreover, the normal direction of the major surfaces of the main bodies 10a of the semiconductor modules 10 is perpendicular to the alignment direction. Such an arrangement of the semiconductor modules 10 may be referred to as a "planar arrangement".

Moreover, the electric power conversion apparatus 101 according to the present embodiment includes a wireless communication unit 130. The wireless communication unit 130 has a plurality of first communication devices 31 mounted on the lower surface 20b of the control circuit board 20 and a plurality of second communication devices 32 each of which is mounted on the upper surface 10b of the main body 10a of a corresponding one of the semiconductor modules 10.

Furthermore, the electric power conversion apparatus 101 according to the present embodiment includes a cooler 6 that is arranged under a partition wall 3a of the case 3 to cool the semiconductor modules 10. The semiconductor modules 10 are arranged on an upper surface of the partition wall 3a and thus separated from the cooler 6 by the partition wall 3a. Moreover, in the cooler 6, there is formed a cooling space 6a through which a coolant flows. Furthermore, the cooler 6 has an inflow pipe 8 connected to the upstream side of the cooling space 6a and an outflow pipe 9 connected to the downstream side of the cooling space 6a.

In addition, the electric power conversion apparatus 101 according to the present embodiment may have either the wireless communication structure shown in FIG. 4 or the wireless communication structure shown in FIG. 5.

According to the present embodiment, it is possible to achieve the following advantageous effects.

In the case of arranging the semiconductor modules 10 in a planar manner and connecting control terminals of the semiconductor modules 10 to the control circuit board 20 in a wired manner, it is easy for positional deviations of the control modules to occur due to large intervals between the adjacent semiconductor modules 10 in the second direction Y, making the assembly process of the electric power conversion apparatus difficult. In contrast, the electric power conversion apparatus 101 according to the present embodiment does not involve such a problem because no wired connections are necessary between the semiconductor modules 10 and the control circuit board 20.

Hence, according to the present embodiment, it becomes possible to improve the ease of assembly of the electric power conversion apparatus 101, which has the semiconductor modules 10 arranged in the planar manner, while realizing wireless communication between the semiconductor modules 10 and the control circuit board 20.

While the above particular embodiments have been shown and described, it will be understood by those skilled in the art that various modifications, changes and improvements may be made without departing from the spirit of the present disclosure.

For example, in the second embodiment, the electric power conversion apparatus 101 includes the cooler 6 for cooling the semiconductor modules 10. However, the cooler 6 may be omitted from the configuration of the electric power conversion apparatus 101 in cases where it is unnecessary to cool the semiconductor modules 10 or the electric power conversion apparatus 101 employs a cooling element instead of the cooler 6.

In the above-described embodiments, each of the semiconductor modules 10 has a pair of semiconductor switching elements 11 built therein. However, each of the semiconductor modules 10 may have only one semiconductor element or three or more semiconductor elements built therein.

In the above-described embodiments, the control circuit board 20 is mounted to the cover 4 that covers the opening of the case 3. However, the control circuit board 20 may alternatively be mounted to the case 3.

In the above-described embodiments, the wireless communication unit 30 (or 130) is configured to perform two-way communication between each corresponding pair of the first communication devices 31 and the second communication devices 32. However, the wireless communication unit 30 (or 130) may alternatively be configured to perform only one-way communication between each corresponding pair of the first communication devices 31 and the second communication devices 32. For example, each of first communication devices 31 may be configured to function only as a transmitter; and each of the second communication devices 32 may be configured to function only as a receiver. Otherwise, each of first communication devices 31 may be configured to function only as a receiver; and each of the second communication devices 32 may be configured to function only as a transmitter.

In the above-described embodiments, each of the first communication devices 31 is mounted on the lower surface 20b of the control circuit board 20; and each of the second communication devices 32 is mounted on the upper surface 10b of the main body 10a of a corresponding one of the semiconductor modules 10. However, the mounting locations of the first and second communication devices 31 and 32 are not particularly limited. For example, each of the first communication devices 31 may alternatively be mounted on the upper surface 20a of the control circuit board 20; and each of the second communication devices 32 may alternatively be mounted on a side surface of the main body 10a of a corresponding one of the semiconductor modules 10.

What is claimed is:

1. An electric power conversion apparatus comprising:
    a semiconductor module having at least one semiconductor element built therein;
    a control circuit board configured to control the semiconductor module; and
    a wireless communication unit configured to wirelessly communicate electrical signals between the semiconductor module and the control circuit board,
    wherein
    the wireless communication unit comprises a first communication device provided on the control circuit board so as to face the semiconductor module, and a second communication device provided on the semiconductor module so as to face the control circuit board, and
    there are no obstacles on a straight path between the first and second communication devices.

2. The electric power conversion apparatus as set forth in claim 1, wherein
    the semiconductor module has a plurality of semiconductor elements built therein, and
    the wireless communication unit comprises a plurality of second communication devices each corresponding to one of the plurality of semiconductor elements of the semiconductor module, and a plurality of first communication devices each corresponding to one of the plurality of second communication devices.

3. The electric power conversion apparatus as set forth in claim 1, further comprising:
    a case which has an opening and in which the semiconductor module is received; and
    a cover that covers the opening of the case,
    wherein
    the control circuit board is mounted to a part of the cover, the part of the cover facing the semiconductor module.

4. The electric power conversion apparatus as set forth in claim 1, wherein
    the electric power conversion apparatus comprises a plurality of semiconductor modules each having at least one semiconductor element built therein, and a cooler configured to cool the semiconductor modules,
    the cooler includes a plurality of cooling pipes through which a coolant flows, and
    the cooling pipes are stacked alternately with the semiconductor modules in a stacking direction, the stacking direction being parallel to an extending plane of the control circuit board and coinciding with a thickness direction of the semiconductor elements of the semiconductor modules.

5. The electric power conversion apparatus as set forth in claim 1, wherein
    the electric power conversion apparatus comprises a plurality of semiconductor modules each having at least one semiconductor element built therein, and
    the semiconductor modules are arranged in alignment with each other in an alignment direction, the alignment direction being parallel to an extending plane of the control circuit board and perpendicular to a thickness direction of the semiconductor elements of the semiconductor modules.

* * * * *